United States Patent [19]
Choi

[11] Patent Number: 5,869,161
[45] Date of Patent: Feb. 9, 1999

[54] TAPE COMPRISING SOLVENT-CONTAINING NON-TACKY, FREE-STANDING, FULLY IMIDIZED POLYIMIDE FILM

[75] Inventor: Jin-O Choi, Getzville, N.Y.

[73] Assignee: Occidental Chemical Corporation, Niagara Falls, N.Y.

[21] Appl. No.: 664,728

[22] Filed: Jun. 17, 1996

[51] Int. Cl.⁶ .......................................................... C09J 7/02
[52] U.S. Cl. ..................... 428/41.7; 156/331.1; 428/41.8; 428/355 R; 428/355 N; 428/906
[58] Field of Search ........................... 428/355 R, 355 N, 428/41.7, 41.8, 906; 156/331.1

[56] References Cited

U.S. PATENT DOCUMENTS 4,480,009  10/1984  Berger ...................................... 428/447
5,091,251  2/1992  Sakumoto ................................. 428/354

FOREIGN PATENT DOCUMENTS

464371A1   5/1991  European Pat. Off. .
0479018A2  9/1991  European Pat. Off. .
03064386   8/1989  Japan .

*Primary Examiner*—Jenna Davis
*Attorney, Agent, or Firm*—Richard D. Fuerle; Anne E. Brookes

[57] ABSTRACT

Disclosed is a tape which comprises a non-tacky, free-standing, 90 to 100% imidized polyimide film containing 0.1 to 30 wt % of a solvent having a releasable film adhering to at least one side. The film is used to form coatings on substrate or as an adhesive to bond substrates together.

20 Claims, No Drawings

TAPE COMPRISING SOLVENT-CONTAINING NON-TACKY, FREE-STANDING, FULLY IMIDIZED POLYIMIDE FILM

CROSS-REFERENCE TO RELATED APPLICATIONS

This application is related to application Ser. No. 08/557,583, filed Nov. 14, 1995 by Jin-O Choi, titled, "Method of Making Free-Standing Polyimide Film, now U.S. Pat. No. 5,604,041." It is also related to application Ser. No. 08/032,033, filed Mar. 16, 1993 by J. C. Rosenfeld et al., titled, "Three Layer Polyimidesiloxane Adhesive Tape now abandoned."

BACKGROUND OF THE INVENTION

This invention relates to a tape that comprises a polyimide film having at least one releasable film adhering to it. In particular, it relates to a solvent-containing non-tacky, free-standing fully imidized film in the tape. Polyimide films are used in the electronic industry as coatings and as adhesives. For these purposes it is desirable to have films contain as little solvent as possible because the solvent tends to pick up moisture, which can cause the films to peel off.

SUMMARY OF THE INVENTION

I have discovered that films that deliberately contain a significant amount of solvent as a plasticizer can be used as coatings and adhesives if a post baking step is used to remove the solvent. The presence of solvent as a plasticizer in the films of this invention significantly lowers the processing temperature required to bond the films to substrates and makes better contact and coverage on substrates by improving the flow. While temperatures of about 220° to about 400° C. were required for bonding previous low-solvent films with high pressure, the new high-solvent films of this invention can be bonded at temperatures of only about 100° to about 180° C. with less pressure. These lower temperatures and pressures will result in less damage to electronic parts, such as oxidation of circuitry and cracking of the fine wires. Also, less energy is required to bond at the lower temperatures.

DESCRIPTION OF THE PREFERRED EMBODIMENTS

The polyimides of this invention are prepared by reacting an aromatic dianhydride with a diamine. Generally, stoichiometric quantities of diamine and dianhydride are used to obtain the highest molecular weight polyimide but the equivalent ratio of dianhydride to diamine can range from 1:2 to 2:1.

Aromartic Dianhydride

Examples of suitable aromatic dianhydrides include:
1,2,5,6-naphthalene tetracarboxylic dianhydride;
1,4,5,8-naphthalene tetracarboxylic dianhydride;
2,3,6,7-naphthalene tetracarboxylic dianhydride;
2-(3',4'-dicarboxyphenyl) 5,6-dicarboxybenzimidazole dianhydride;
2-(3',4'-dicarboxyphenyl) 5,6-dicarboxybenzoxazole dianhydride;
2-(3',4'-dicarboxyphenyl) 5,6-dicarboxybenzothiazole dianhydride;
2,2',3,3'-benzophenone tetracarboxylic dianhydride;
2,3,3',4'-benzophenone tetracarboxylic dianhydride;
3,3',4,4'-benzophenone tetracarboxylic dianhydride (BTDA);
2,2',3,3'-biphenyl tetracarboxylic dianhydride;
2,3,3',4'-biphenyl tetracarboxylic dianhydride;
3,3',4,4'-biphenyl tetracarboxylic dianhydride(BPDA);
bicyclo-[2,2,2]-octen-(7)-2,3,5,6-tetracarboxylic-2,3,5,6-dianhydride;
thio-diphthalic anhydride;
bis (3,4-dicarboxyphenyl) sulfone dianhydride;
bis (3,4-dicarboxyphenyl) sulfoxide dianhydride;
bis (3,4-dicarboxyphenyl oxadiazole-1,3,4) paraphenylene dianhydride;
bis (3,4-dicarboxyphenyl) 2,5-oxadiazole 1,3,4-dianhydride;
bis 2,5-(3',4'-dicarboxydiphenylether) 1,3,4-oxadiazole dianhydride;
bis (3,4-dicarboxyphenyl) ether dianhydride or 4,4'-oxydiphthalic anhydride (ODPA);
bis (3,4-dicarboxyphenyl) thioether dianhydride;
bisphenol A dianhydride;
bisphenol S dianhydride;
2,2-bis (3,4-dicarboxyphenyl) hexafluoropropane dianhydride or 5,5-[2,2,2-trifluoro-1-(trifluoromethyl) ethylidene] (6FDA);
bis-1,3-isobenzofurandione);
hydroquinone bisether dianhydride;
bis (3,4-dicarboxyphenyl) methane dianhydride;
cyclopentadienyl tetracarboxylic acid dianhydride;
cyclopentane tetracarboxylic dianhydride;
ethylene tetracarboxylic acid dianhydride;
perylene 3,4,9,10-tetracarboxylic dianhydride;
pyromellitic dianhydride (PMDA);
tetrahydrofuran tetracarboxylic dianhydride; and
resorcinol dianhydride.

The dianhydrides can be used in their tetraacid form or as mono, di, tri, or tetra esters of the tetraacid, but the dianhydride form is preferred because it is more reactive. The preferred dianhydrides are ODPA, BPDA, BTDA, 6FDA, and PMDA or mixtures thereof, as these dianhydrides are readily available and have been found to give superior properties. The most preferred dianhydride is ODPA because it gives a polyimidesiloxane having better adhesion and good flexibility with low moisture absorption.

Diamine

The diamine used in preparing the polyamic acid is preferably aromatic as aromatic diamines give polyimides having the best properties. Examples of aromatic diamines include:
m- and p-phenylenediamine;
2,4-diaminotoluene (TDA);
2,5- and 2,6-diaminotoluene;
p- and m-xylenediamine;
4,4'-diaminobiphenyl;
4,4'-diaminodiphenyl ether or 4,4'-oxydianiline; (ODA)
3,4'-oxydianiline;
4,4'-diaminobenzophenone;
3,3', 3,4', or 4,4-diaminophenyl sulfone or m,m-, m,p- or p,p- sulfone dianiline;
4,4'-diaminodiphenyl sulfide;
3,3'-diaminodiphenyl sulfone (APS);
3,3' or 4,4'-diaminodiphenylmethane or m,m- or p,p-methylene dianiline;
3,3'-dimethylbenzidine;
2,2'-bis[(4-aminophenyl)-1,4-diisopropyl]benzene or 4,4'-isopropylidenedianiline or bisaniline P(BAP);
2,2'-bis[(4-aminophenyl)-1,3-diisopropyl]benzene or 3,3'-isopropylidenedianiline or bisaniline M; methylene dianiline;

1,4-bis(4-aminophenoxy)benzene;
1,3-bis(4-aminophenoxy)benzene;
1,3-bis(3-aminophenoxy)benzene (APB);
4,4'-bis(4-aminophenoxy)biphenyl;
2,4-diamino-5-chlorotoluene;
2,4-diamino-6-chlorotoluene;
2,2-bis-[4(4-aminophenoxy)phenyl] propane (BAPP);
trifluoromethyl-2,4-diaminobenzene;
trifluoromethyl-3,5-diaminobenzene;
2,2-bis(4-aminophenyl)-hexafluoropropane (6F diamine);
2,2-bis(4-phenoxy aniline) isopropylidene;
2,4,6-trimethyl-1,3-diaminobenzene;
4,4'-diamino-5,5'-trifluoromethyl diphenyloxide;
3,3'-diamino-5,5'-trifluoromethyl diphenyloxide;
4,4'-trifluoromethyl-2,2'-diamino biphenyl;
2,5-dimethyl-1,4-phenylenediamine (DPD);
2,4,6-trimethyl-1,3-diaminobenzene;
diaminoanthraquinone;
4,4'-oxybis[(2-trifluoromethyl)benzeneamine] (1,2,4-OBABTF);
4,4'-oxybis[(3-trifluoromethyl)benzeneamine];
4,4'-thiobis[(2-trifluoromethyl)benzeneamine];
4,4'-thiobis[(3-trifluoromethyl)benzeneamine];
4,4'-sulfoxylbis[(2-trifluoromethyl)benzeneamine];
4,4'-sulfoxylbis[(3-trifluoromethyl)benzeneamine];
4,4'-ketobis[(2-trifluoromethyl)benzeneamine];
4,4'-[(2,2,2-trifluoromethyl-1-(trifluoromethyl)-ethylidine)bis(3-trifluoromethyl)benzeneamine]; and
4,4'-dimethylsilylbis[(3-trifluoromethyl)benzeneamine].

The preferred aromatic diamines are ODA, TDA, APB, DPD, and BAPP due to the excellent properties of film made using them.

Siloxane Monomer

Preferably, the polyamic acid is prepared using a mixture of a diamine that does not contain siloxane groups and a diamine that contains siloxane groups or from a mixture of a dianhydride that contains siloxane groups and a dianhydride that does not contain siloxane groups. The siloxane-containing compounds may be either aromatic or non-aromatic, but non-aromatic compounds are preferred as they are more readily available.

Examples of siloxane diamines that can be used include diamines having the formula

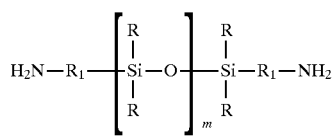

Examples of siloxane dianhydrides that can be used include compounds having the formula

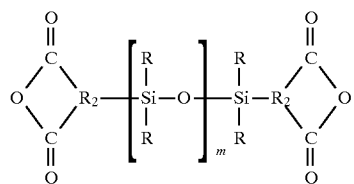

where R, $R_1$, and $R_2$ are mono, di, and triradicals, respectively, each independently selected from a substituted or unsubstituted 1 to 12 carbon atom aliphatic group or a substituted or unsubstituted 6 to 10 carbon atom aromatic group. Examples of monoradicals include —$CH_3$, —$CF_3$, —CH=$CH_2$, —$(CH_2)_nCF_3$, —$C_6H_5$, —$CF_2$—CHF—$CF_3$, and —$CH_2$—$CH_2$—CO—O—$CH_2CF_2CF_2CF_3$. Examples of diradicals include —$(CH_2)_n$—, —$(CH_2)_nCF_2$— and —$C_6H_4$—. Examples of triradicals include —CH—$CH_2$—,

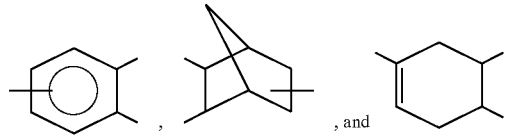

where n=1 to 10 and m is 1 to 200, but is preferably 1 to 12. (Siloxane diamines are herein denoted by the notation "$G_m$".) To prepare a polyimidesiloxane film, the polyamic acid can be made from about 1 to about 80 wt % siloxane-containing monomers and about 20 to about 99 wt % monomers that do not contain siloxane. Preferably, it is made from about 1 to about 30 wt % siloxane-containing monomers and about 70 to about 99 wt % monomers that do not contain siloxane.

Polyamic Acid

The polyamic acid is typically prepared in solution. The solvent used to form the solution of the polyamic acid must, of course, dissolve the polyamic acid. Suitable solvents depend upon the particular composition of the polyamic acid that is to be made and dissolved, but may include N-methyl-2-pyrrolidone (NMP), toluene, xylene, benzene, diglyme, triglyme, cyclohexanone, cyclopentanone, dimethylacetamide, and mixtures of these solvents. The solvent preferably has a boiling point between 130° and 210° C. as lower boiling solvents may evaporate too readily from the completed film and higher boiling solvents may be too difficult to remove from the film. The polyamic acid solution can be about 10 to about 40 wt % solids, but is preferably about 25 to about 35 wt % solids as more dilute solutions mean more solvent to evaporate and more concentrated solutions are too viscous. Particularly preferred polyamic acid adhesives can be made from ODPA, APB, and $G_9$ in NMP, and from BPDA, BTDA, BAPP, $G_1$, and DPD in NMP. The reaction that forms the polyamic acid occurs at about room temperature.

The polyamic acid is then fully imidized, which means that 90 to 100% polyamic acid groups are imidized. Imidization is done in a solvent in which the fully imidized polyimide is soluble. Imidization can be accomplished by heating at a temperature of about 130° to about 170° C. The amount of imidization that has occurred can be determined by infrared spectrum analysis, by measuring the amount of water given off in forming the imide groups by acid titration, or by heating to predetermined times. The amount of heating necessary to achieve full imidization will depend on the particular monomers used.

Film and Tape

The solution of the fully imidized polyimide is then cast onto a releasable film such as polytetrafluoroethylene (PTFE), polyethylene (PE), or a polyester such as polyethylene terephthalate (PET). Casting can be performed at room temperature using a doctor blade, spin coating, or other suitable means. A solution of about 25 to about 35 wt % solids is satisfactory for casting the film.

The coated substrate is heated to a temperature high enough to evaporate some of the solvent and form a film that can be stripped from the releasable film and handled without damage. A second releasable film can be placed over the polyimide film, if desired. Depending on the solvent used, solvent can usually be evaporated by heating at about 80° to about 120° C. However, the film should still contain about 0.1 to about 30 wt %, and preferably about 1 to about 10 wt %, of the solvent, which remains as plasticizer. The polyimide film is typically about 25 µm (1 mil) to about 0.5 mm (20 mils) thick.

The resulting tape, i.e., polyimide film with the releasable film adhering to it, can then be rolled up for later use, or a second releasable film can be placed over the exposed side of the polyimide film before the tape is rolled up. To use the tape, it is unrolled (if it was previously rolled) and the polyimide film is exposed (if it is not exposed) and placed against the substrate to which it is to be bonded. If the polyimide film is to be used as a coating it is pressed against the substrate with a releasable film on an opposite substrate.

Adherance of the polyimide film to a substrate as a coating can be accomplished by heating the tape to about 100° to about 180° C. while pressing it against the substrate at no pressure or a pressure of up to about 690 kPa (100 psi). This can be accomplished, for example, by passing the tape and substrate through a heated roller. After the releasable film is removed, the coated substrate is baked at about 200° to about 250° C. to completely remove the solvent. The polyimide coating mechanically and chemically protects the substrate from the environment. To attach the polyimide film coated substrate after post baking to another substrate, such as the nickel-iron alloy, "Alloy 42," a good bond can be achieved by hot pressing at about 220° to about 400° C. and about 70 to about 3450 kPa (about 10 to about 500 psi).

If the tape is to be used as an adhesive, the polyimide film is exposed on both surfaces (i.e., all releasable films are removed) and a second substrate is placed opposite the first substrate prior to the application of the pressure. Solvent remaining in the polyimide film is removed by a slow post baking step at a temperature that exceeds the boiling point of the solvent, typically, at 200° to 250° C. for about an hour.

Additives

In order to modify film properties such as solubility, mechanical strength, cross linking, adhesion, etc., various compounds containing epoxy, maleimide, acetylene, or other functional groups, can be added to the resin solution. For better bonding, it is preferable to mix an epoxy resin with the monomers. About 1 to about 40 wt % of the total monomer weight can be epoxy resin. The epoxy resin can contain 1, 2, or 3 epoxy groups. The epoxy can be aliphatic or aromatic but aromatic epoxy resins are preferred as they have better mechanical properties.

If an epoxy resin is used, it is also preferable to add about 1 to about 10 wt % (based on total monomer weight) of a phenolic resin. This promotes a better flowing of the film and acts as a curing agent for the epoxy resin.

About 0.5 to about 5 wt % (based on total monomer weight) of a coupling agent can be used to promote adhesion of the polyimide film to metals and to help crosslink the epoxy resin. Samples of suitable coupling agents include N-(triethoxysilylpropyl)urea, 3-glycidoxypropyltrimethoxysilane, 3-methacryloxypropyltrimethoxysilane and N-2-aminoethyl-3-aminopropyltrimethoxysilane. The use of a coupling agent is preferred only if the polyimide film is being bonded to a metal surface.

The following examples further illustrate this invention.

EXAMPLE 1

To a 2 liter three-necked flask equipped with a mechanical stirrer, a reflux condenser, a Dean-Stark trap, and a thermometer was added 540 ml dry NMP and 136 g toluene, followed by 193 g ODPA, 12.5 g $G_1$ and 125.2 g $G_9$ with stirring. After stirring for 4 hours at room temperature, 123.6 g APB was added and the mixture was stirred overnight to polymerize the monomers. To imidize the polyamic acid in the solution, the temperature was raised to 165° C. The aqueous phase was removed in a Dean-Stark trap during a 3 hour azeotropic distillation. The viscosity of the solution was 9000 mPa·sec (9000 cps) with 40 wt % resin content and the imidization was 97%, as measured by the acid titration method. The molecular weight (Mn) by gel permeation chromatography (GPC) was 13,347 g/mole and the polydispersity (Mw/Mn) was 5.3.

Using a 0.25 mm (10 mil) blade, the resin solution was coated on to a 71 um (2.8 mil) Mylar film lubricated with a release agent and dried at 120° C. in a convection oven. Some of NMP in the dry film remained as a plasticizer and the solids content was 16.8 wt %, 10.6 wt %, and 8.8 wt % for 15, 30, and 60 minutes drying, respectively. The dry polyimidesiloxane film on the Mylar film or the standing dry polyimidesiloxane film was laminated on to the copper/Kapton flexible circuit at about 135° C. using a laminating machine. After the Mylar had been peeled off, the temperature of the substrate was raised at 4° C./min and the film was baked at 180° C. for 30 minutes. and 220° C. for 30 minutes. The cured film on the flexible circuits was able to protect the copper wires under operating conditions in electronic equipment.

In order to modify the film properties, the resin solution was also mixed with epoxy resins such as Ciba-Geigy Araldite CY179, Dow Chemical DER-332, and Ciba-Geigy Araldite CY285 or YH4000H, in the range of 10 to 50 parts per part by weight of resin. Epoxy blends were also made using phenolic resins and/or coupling agents. Polyimidesiloxane-epoxy hybrid dry films prepared under the same conditions described above showed good protection of copper wires under the chemical and mechanical conditions of printing machines.

EXAMPLE 2

To a 2 liter three-necked flask equipped with a mechanical stirrer, a reflux condenser, a Dean-Stark trap, and a thermometer, containing 376 ml NMP and 47 g toluene, 96.5 g ODPA, 2 g $G_1$ and 20.4 g $G_9$ were added. After stirring for 4 hours at room temperature, 81.4 g APB was added and the monomers were polymerized overnight. The polyamic acid was imidized in the solution by raising the temperature to 165° C. and refluxing for 3 hours while removing the aqueous phase in a Dean-Stark trap. When the solution had cooled to room temperature, the viscosity of the solution was 12,340 mpa·sec (12,340 cps) with 30 wt % resin content and the imidization measured by acid titration was 97.4%. The molecular weight (Mn) by GPC was 12,464 g/mole and the polydispersity (Mw/Mn) was 4.3.

The resin solution was cast onto Mylar film treated with a release agent using a 0.25 mm (10 mil) blade and dried in a convection oven at 50° C. and 80° C. for 15, 30, and 60 minutes.

The residual NMP under these drying conditions was as follows.

| Drying Time | 50° C. | 80° C. |
| --- | --- | --- |
| 15 min. | 36 wt % | 9.1 wt % |
| 30 min. | 18.4 wt % | 5.8 wt % |
| 60 min. | 8.4 wt % | 2.0 wt % |

The toluene was less than 100 ppm in all the samples.

The sample containing 36 wt % NMP was sticky and difficult to handle as a dry film for the storing, delivering, and laminating processes. The other films were not sticky; they were covered with polyethylene (PE) film to prevent residual solvent from evaporating during storage and delivery. The following table gives the mechanical properties of the films:

| Drying Time | Breaking Strength | | Breaking Elongation | Modulus | |
|---|---|---|---|---|---|
| (at 8° C.) | (MPa) | (psi) | (%) | (MPa) | (psi) |
| 15 min | 38 | 5492 | 5.1 | 1100 | $1.6 \times 10^5$ |
| 30 min | 43 | 6199 | 5.2 | 1172 | $1.7 \times 10^5$ |
| 60 min | 46 | 6637 | 6.5 | 1241 | $1.8 \times 10^5$ |

To laminate the film onto flexible circuits, the releasable PE film was peeled off and the dry film on Mylar or the standing dry film was overlayed onto the substrate. After laminating at about 100° to 150° C., the Mylar film was peeled off, the substrate temperature was raised to about 200° to 250° C. at 2° to 8° C./min, and the film was baked to eliminate all residual NMP. During the baking process, the dry film flowed easily due to the presence of residual NMP and cover the copper wires completely. The baked film on the circuits protected copper wires from chemical and mechanical damage under the operating conditions of the electronic equipment.

EXAMPLE 3

A one liter three-necked flask equipped with a mechanical stirrer, a reflux condenser, a Dean-Stark trap, and a thermometer, was filled with 500 ml dry NMP and 95 ml toluene to the flask was added 30.3 g BPDA, 14.2 g BDTA, and 7.4 g $G_1$ and the reaction mixture was stirred at room temperature for 4 hours. Then 36.1 g BAPP and 4 g 2,5-dimethyl-1, 4-phenylenediamine (DPD) were added and stirred overnight at room temperature. For imidization in the solution, the temperature was raised to 155° C. and the solution was refluxed for 4 hours while removing the aqueous phase in the Dean-Stark trap. The viscosity of the solution was 3800 mpa·sec (3800 cps) and the imidization was 96%, as measured by the acid titration method.

The resin solution was cast onto the release side of a 71 mm (2.8 mil) Mylar film using a 0.25 mm (10 mil) blade and dried in a convection oven at 120° C. for 6 minutes. The dry film on Mylar or the standing dry film was laminated onto electronic circuits at about 135° C. After the Mylar film had been peeled off, the substrate was raised at 8° C./min to 180° C., baked for 10 minutes, then raised to 250° C. at 4° C. and baked for 60 minutes. The laminated circuits were well protected from the chemical and mechanical environment of the electronic equipment. The substrate coated with film could be attached to Alloy 42 by hot pressing at 300° C. and 3450 kPa (500 psi) for 60 sec.

EXAMPLE 4

To a 10 g solution of Example 2, 0.93 g of Dow Chemical Co.'s epoxy resin "DER-332" was added. When the mixed solution was coated onto a Mylar film with a 0.25 mm (10 mil) blade and dried in a convection oven at 120° C. for 15 and 30 minutes, the residual NMP in the dry film was 0.79 wt % and 0.16 wt %, respectively. The standing dry film or the dry film on the Mylar was laminated onto the flexible circuits at about 140° C. and the substrate was raised to 250° C. at 4° C./min. and baked for 60 minutes. The cured film had an excellent adhesion to Kapton and copper and showed good protection of copper wires from an ink environment.

EXAMPLE 5

To a 10 g solution prepared in Example 2, 0.93 g of Dow Chemical Co.'s epoxy resin "DER-332" and a 0.4 g of the coupling agent, N-(triethoxysilylpropyl) urea (50% in methanol), were mixed to modify the film properties. The mixed solution was coated onto the release side of a 71 mm (2.8 mil) Mylar film by using a 0.25 mm (10 mil) blade and dried in a convection oven at 80° C. for 15 and 60 minutes. The residual NMP was 10 wt % and 3 wt %, respectively. The standing dry film or the dry film on Mylar was laminated onto electronic circuits at about 135° C. After the Mylar film had been peeled off, the laminated substrates were raised to 180° C. at 8° C./min., baked for 10 min., then raised to 250° C. at 4° C./min and baked for 60 min. The cured circuits were well protected from the chemical and mechanical environment in the electronic equipment.

EXAMPLE 6

To modify the film properties, 0.93 g Dow Chemical Co.'s epoxy resin, "DER-332," 0.4 g N-(triethoxysilylpropyl) urea (50% in methanol), and 0.3 g phenolic resin were mixed into a 9.3 g of a solution prepared in Example 2. When the mixed solution was coated onto Mylar film with a 0.25 mm (10 mil) blade and dried in a convection oven at 120° C. for 15 min. and 30 min., the residual NMP was 1.55 wt % and 0.36 wt %, respectively. The standing dry film or the dry film on the Mylar film was able to laminate onto the flexible circuits at about 135° C. The laminated film on the substrate was cured in an oven at 250° C. for 60 min. after ramping at a 3° C./min. rate from room temperature. The cured film showed excellent adhesion on Kapton film and copper wires and protected circuits in electronic equipment.

We claim:

1. A tape comprising
   (A) a non-tacky, free-standing, 90 to 100% imidized polyimide film containing about 0.1 to about 30 wt % of a solvent, made by reacting an aromatic dianhydride with a mixture of an aromatic diamine that does not contain siloxane and an aliphatic siloxane diamine having the general formula

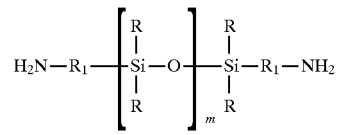

where R and $R_1$ are mono and di radicals, respectively, and m is 1 to 200; and
   (B) a releasable film adhered to at least one side of said polyimide film.

2. A tape according to claim 1 wherein said releasable film is adhered to only one side of said polyimide film.

3. A tape according to claim 2 which is rolled up.

4. A tape according to claim 1 wherein a releasable film is adhered to each side of said polyimide film.

5. A tape according to claim 4 which is rolled up.

6. A tape according to claim 1 wherein said mixture is about 1 to about 80 wt % of said aliphatic siloxane diamine and about 20 to about 99 wt % of said aromatic diamine.

7. A tape according to claim 1 wherein the amount of said solvent is 1 to 10 wt %.

8. A tape according to claim 1 wherein said polyimide film is about 25 um to 0.5 mm thick.

9. A tape according to claim 1 wherein said polyimide film contains 1 to 40 wt % of an epoxy.

10. A tape according to claim 9 wherein said polyimide film contains 1 to 10 wt % of a phenolic resin.

11. A tape according to claim 1 wherein said polyimide film contains 0.5 to 5 wt % of a coupling agent.

12. A method of bonding two substrates together comprising (A) removing all releasable film from a tape according to claim 1;

(B) placing said polyimide film in between said substrates;

(C) pressing said substrates together at a pressure up to 690 kPa and a temperature of about 100° to about 180° C.; and (D) baking said film at about 200° to about 250° C. to remove remaining solvent.

13. A method of forming a polyimide coating on a substrate comprising (A) placing the exposed surface of the polyimide film of a tape according to claim 2 against said substrate;

(B) pressing said tape against said substrate at a pressure up to 690 kPa and a temperature of about 100° to about 180° C.;

(C) removing said releasable film; and (D) baking said polyimide film at about 200° to about 250° C. to remove remaining solvent.

14. A method according to claim 13 including the additional last step of hot pressing said polyimide film to a second substrate at about 220° to about 400° C. and about 70 to about 3450 kPa.

15. A rolled-up tape comprising a releasable film in contact with a non-tacky, free-standing, 90 to 100% imidized polyimidesiloxane film containing 1 to 10 wt % solvent, made by reacting an aromatic dianhydride with a mixture of about 70 to about 99 wt % of an aromatic diamine that does not contain siloxane and about 1 to about 30 wt % of an aliphatic diamine having the general formula

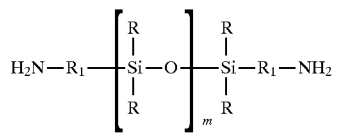

where R and $R_1$ are mono and di radicals, respectively, and m is 1 to 12.

16. A rolled-up tape according to claim 15 wherein said polyimide film contains 1 to 40 wt % of an epoxy.

17. A rolled-up tape according to claim 15 wherein said polyimide film contains 1 to 10 wt % of a phenolic resin.

18. A rolled-up tape comprising a releasable film in contact with each side of a non-tacky, free-standing 90 to 100% imidized polyimidesiloxane film containing 1 to 10 wt % solvent, made by reacting an aromatic dianhydride with a mixture of about 70 to about 99 wt % of an aromatic diamine that does not contain siloxane and about 1 to about 30 wt % of an aliphatic diamine having the general formula

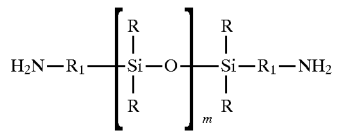

where R and $R_1$ are mono and di radicals, respectively, and m is 1 to 12.

19. A rolled-up tape according to claim 18 wherein said polyimide film contains 1 to 40 wt % of an epoxy.

20. A rolled-up tape according to claim 18 wherein said polyimide film contains 1 to 10 wt % of a phenolic resin.

* * * * *